United States Patent [19]
Furumiya et al.

[11] Patent Number: 5,148,276
[45] Date of Patent: Sep. 15, 1992

[54] SYNCHRONOUS SIGNAL GENERATOR FOR THE MUSE SIGNAL

[75] Inventors: Shigeru Furumiya, Katano; Yoshinari Takemura, Settsu; Hiromu Kitaura, Osakasayama, all of Japan

[73] Assignee: Matsushita Electric Industrial Co., Ltd., Osaka, Japan

[21] Appl. No.: 620,194

[22] Filed: Nov. 30, 1990

[30] Foreign Application Priority Data

Dec. 5, 1989 [JP] Japan .................. 1-314359

[51] Int. Cl.⁵ .......................... H04N 5/08; H04N 5/04
[52] U.S. Cl. .......................... 358/153; 358/148
[58] Field of Search ............ 358/148, 153, 154, 149, 358/158, 150, 151; 331/20, 1 R; 375/120

[56] References Cited

U.S. PATENT DOCUMENTS

| | | | |
|---|---|---|---|
| 4,769,704 | 9/1988 | Hirai et al. | 358/148 |
| 4,958,228 | 9/1990 | Kutsuki | 358/158 |
| 4,974,081 | 11/1990 | Yokogawa | 358/148 |
| 5,008,751 | 4/1991 | Wischermann et al. | 358/148 |

FOREIGN PATENT DOCUMENTS

61-261973 11/1986 Japan .
3023775 1/1991 Japan .

*Primary Examiner*—James J. Groody
*Assistant Examiner*—Safet Metjahic
*Attorney, Agent, or Firm*—Wenderoth, Lind & Ponack

[57] ABSTRACT

A synchronous signal generator for use with the MUSE signal in the MUSE system which is a high definition television systems. A PLL circuit including a phase comparator and a voltage-controlled oscillator and a counter, is used to generate a system clock synchronized with an external clock. A frame synchronizing signal detected through a frame sychronization detection circuit from an inputted digital MUSE signal frame-resets the counter through a window circuit. The frame synchronization is established at an accuracy of a set range of the window circuit. Also, in this case, if the sychronization deviates on a clock by clock basis, a sampling phase error from a phase error computing circuit is monitored by a comparator circuit so that a deviation in the synchronization can be detected. When the synchronization deviates, by horizonally resetting the counter, the clock synchronization can be established. By effecting the three steps noted above, the synchronous signal generation for the digital MUSE signal can be properly achieved. Also, by combining an arrangement noted above with a conventional synchronous signal for an analog MUSE signal, a synchronous signal generator for both a digital MUSE signal and an analog MUSE signal can be provided.

2 Claims, 5 Drawing Sheets

HORIZONTAL SYNCHRONIZATION POSITION

SYNCHRONOUS SIGNAL GENERATOR FOR THE MUSE SIGNAL

BACKGROUND OF THE INVENTION

1. Field of the Invention

This invention relates to a synchronous signal generator for obtaining a system clock, horizontal synchronizing signal and frame synchronizing signal which are synchronized with a MUSE signal in the MUSE system, which is one of the new high definition television systems.

2. Description of the Prior Art

As a high definition television system which is capable of providing higher resolution image than that of the conventional standard television system, the MUSE (Multiple Sub-Nyquist Sampling Encoding) system has been proposed by NHl. In that system, signal is compressed up to about one-third to the 8 MHz frequency band, thereby allowing one channel transmission by a broadcasting satellite. (See "An HDTV broadcasting system utilizing a bandwidth compression technique:-MUSE", IEEE Trans. Broadcast. Vol. 33, No. 4, pp.130-160 (1987)) This system can be used not only for satellite broadcasting but also for package media such as video disks, VCR's and the like. Mutual communications between the MUSE system units are effected in the form of analog MUSE signals in general.

Generally, when a signal is sent or received as an analog signal between units whose internal processings are executed digitally, a D/A converter, a low-pass filter and a A/D converter are necessary to be additionally used for transmission. On the other hand, if mutual communications between them are effected directly by a digital signal, the components shown above can be eliminated, thus making it possible to simplify the system as well as to prevent the deterioration of a signal. The same result can be obtained in the case when the MUSE system units mutually communicate.

An explanation follows on the synchronization of the MUSE signal. The MUSE signal does not have a negative synchronizing signal, which can be separated by the amplitude separation as used in the conventional video signal, but rather has a positive synchronizing signal which has a special waveform containing both the frame synchronizing signal and the horizontal synchronizing signal in the amplitude of a video signal. That is, the frame synchronizing signal has a signal waveform having the line correlation and the clock correlation in combination and can be detected by pattern matching techniques. Also, the horizontal synchronizing signal has a signal waveform whose sampling phase error relative to the normal horizontal synchronization position can be detected by computing sampling values at the middle point and both ends of the waveform.

The procedures of the synchronous signal generation of the MUSE signal according to the prior art are explained below. First, an inputted analog MUSE signal is converted through an A/D converter into a digital MUSE signal using a system clock. From the digital MUSE signal thus converted, a frame synchronizing signal is detected by pattern matching. A horizontal synchronizing signal is detected by counting the system clock with the detected frame synchronizing signal used as a reference. Then, the sampling phase error of the detected horizontal synchronizing signal is calculated. The sampling phase error thus calculated is fed through a low-pass filter and a D/A converter back to a voltage-controlled oscillator. An output from the voltage-controlled oscillator is frequency-divided to generate a system clock. The system clock thus generated is used as a system clock of the A/D converter to control through a PLL (Phase Locked Loop) circuit. Thus, the synchronous signal generation can be realized in accordance with the above-mentioned arrangement and procedures.

The conventional synchronous signal generation as explained above is contingent upon the synchronous signal generation of an analog MUSE signal and executes an accurate clock phase synchronization by controlling the phase of a sampling clock when performing the A/D conversion. Thus, if a digital MUSE signal is directly inputted, then the clock synchronization cannot be performed, so that it cannot respond to the synchronous signal generation of the digital MUSE signal. That is, even if the phase of a system clock is changed by controlling the voltage-controlled oscillator in response to the sampling phase error, when an input signal is a digital MUSE signal, the clock timing to an inputted data only can change with no change in the value of the inputted data itself. As a result, the loop control is impossible and the synchronization on a clock by clock basis cannot be performed.

SUMMARY OF THE INVENTION

An object of this invention is to provide a synchronous signal generator capable of executing a reliable synchronous signal generation not only for an analog MUSE signal but also for a digital MUSE signal.

In order to attain the above-mentioned object, this invention practically realizes a synchronous signal generator for the MUSE signal as follows:

When a digital MUSE signal is inputted, a system clock synchronized with an external clock inputted simultaneously with the input digital MUSE signal is generated through a PLL circuit. A window is provided for generating a reset signal when the phase difference between an internal frame synchronizing signal and a detected frame synchronizing signal exceeds a predetermined range. Using this reset signal, a counter for generating the internal frame synchronizing signal and internal horizontal synchronizing signal is frame-reset. Thus, the frame synchronization can be established at an accuracy of the predetermined range of the window. In this case, a sampling phase error of the horizontal synchronizing signal is calculated through a phase error computing circuit. A comparator produces a reset signal when the sampling phase error thus calculated exceeds an allowable range. The above-mentioned counter is horizontally reset by this reset signal. The comparator becomes active only when the frame synchronization is established within the predetermined range of the window and a synchronous deviation exists on a clock by clock basis, thus establishing the synchronization in one clock. As explained above, the synchronous signal generation for a digital MUSE signal becomes possible.

On the other hand, when an analog MUSE signal is inputted, a system clock synchronized through a PLL circuit including an A/D converter with the input analog MUSE signal is generated. That is, the sampling phase error is integrated by a low-pass filter and D/A-converted so as to thereby generate a voltage signal. By this voltage signal, a voltage-controlled oscillator (VCO) is controlled and the output of the VCO is frequency-divided by a counter to obtain a system clock. By this system clock, an analog MUSE signal is A/D-converted into a digital MUSE signal. Thereafter, the same processes as those in the synchronous signal generation of a digital MUSE signal are carried out. The sampling phase in one clock is determined through the PLL circuit including the A/D converter.

Namely, a synchronous signal generator of this invention makes it possible for the synchronous signal to be generated both for digital and analog MUSE signals. In addition, almost all of components can be used for both digital and analog MUSE signals, largely contributing to a cost reduction as well as a reduction in size of the system.

DESCRIPTION OF THE PREFERRED EMBODIMENT(S)

Figure 1:
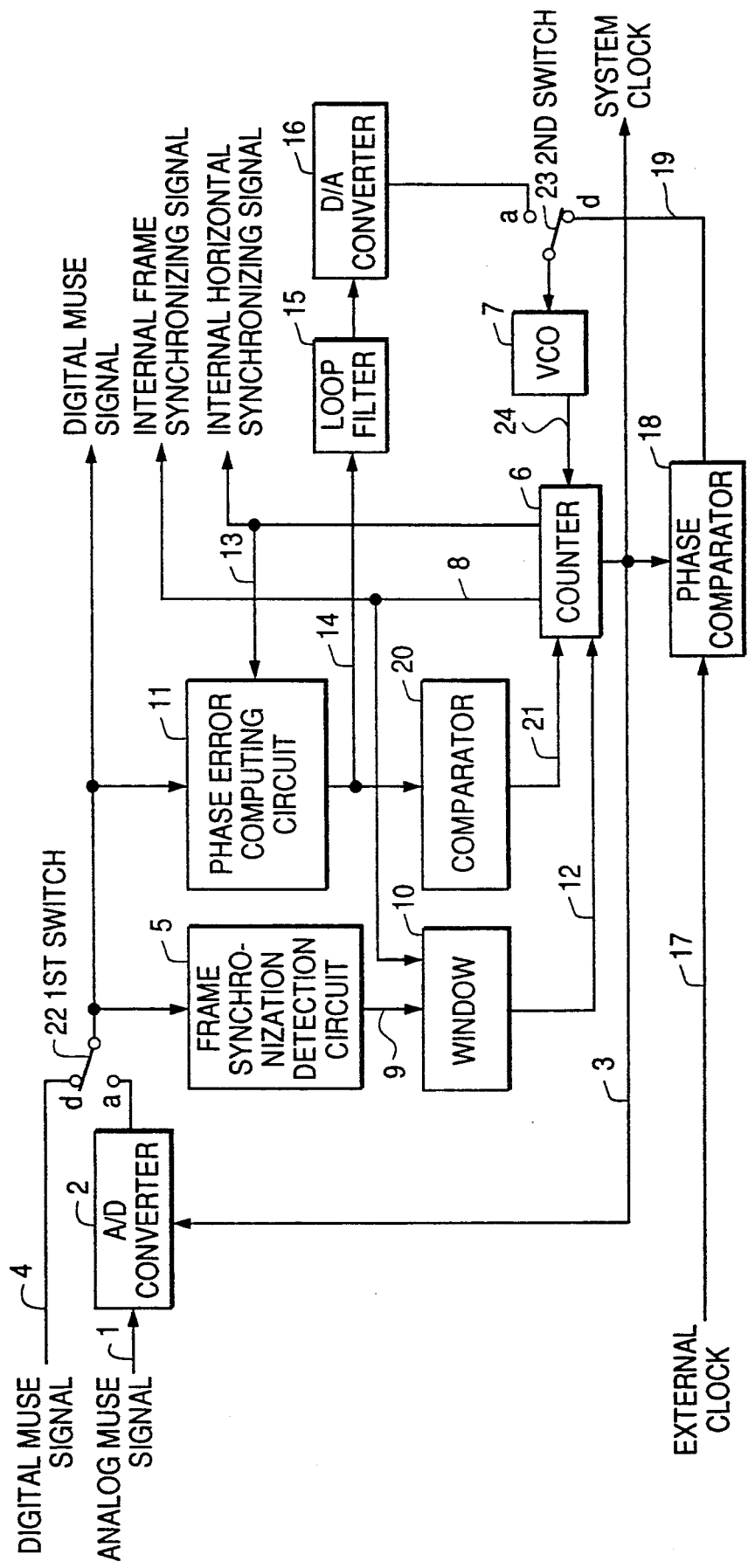
FIG. 1 is a block diagram of a synchronous signal generator for the MUSE signal according to a first embodiment of this invention.

FIG. 1 is a block diagram of a synchronous signal generator according to a first preferred embodiment of this invention. The following description will be made by referring to the drawings. In addition, signals to be inputted in this embodiment may be a digital MUSE signal and an external clock synchronized therewith or may be an analog MUSE signal.

First, an explanation will be made on the synchronous signal generation for the digital MUSE signal. When an input signal is a digital MUSE signal, a first switch 22 and a second switch 23 are switched to the d-side manually or automatically by detecting the input signal.

Figure 2:
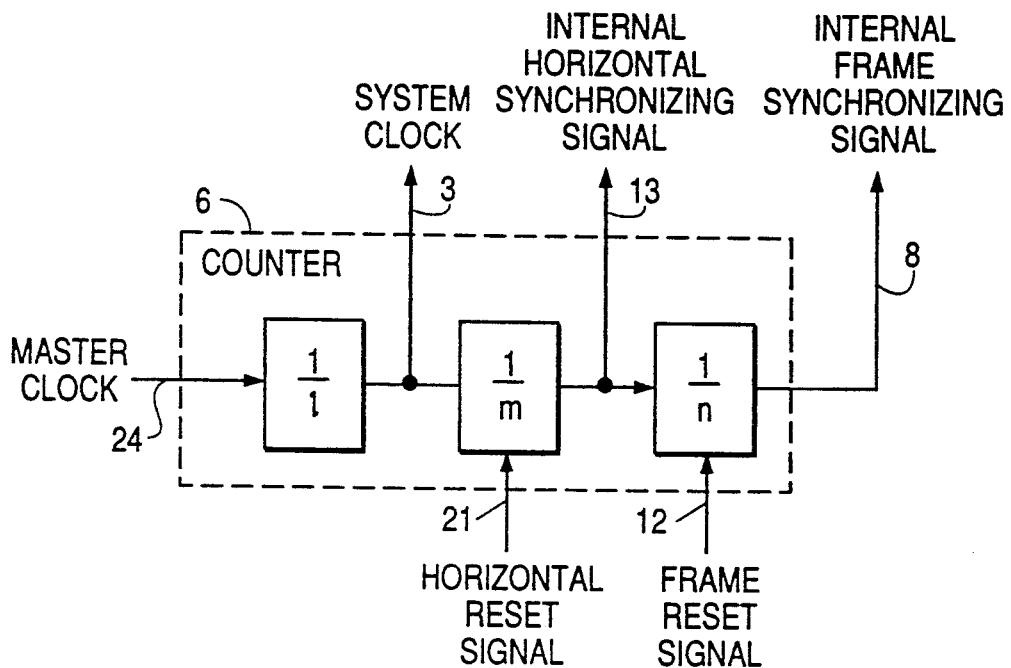
FIG. 2 is a block diagram of a counter shown in FIG. 1.

A counter 6 is arranged as shown in FIG. 2. In FIG. 2, a master clock 24 is frequency-divided into 1/l so as to thereby obtain a system clock 3. Then, the system clock 3 is frequency-divided into 1/m so as to thereby obtain an internal horizontal synchronizing signal 13. The 1/m frequency dividing operation can be reset by a horizontal reset signal 21. In addition, the internal horizontal synchronizing signal 13 is frequency-divided into 1/n so as to thereby obtain an internal frame synchronizing signal 8. The 1/n frequency dividing operation can be reset by a frame reset signal 12. In FIG. 1, a phase comparator circuit 18 compares the phase of an external clock 17 with that of the system clock 3 outputted from the counter 6 to generate a voltage 9 equivalent to the phase difference therebetween. The voltage 9 controls a voltage-controlled oscillator (VCO) 7. The voltage-controlled oscillator 7 outputs a master clock 24 to activate the counter 6. Then, the system clock 3 is synchronized through the PLL circuit with the external clock 17. As a result, the system clock 3 is synchronized with an inputted digital MUSE signal 4. Here, as an example showing preferred values, if the master clock=97.2 MHz, l=6, m=480 and n=1125, then the system clock 3 becomes 16.2 MHz, the internal horizontal synchronizing signal 13 becomes 33.75 KHz and the internal frame synchronizing signal 8 becomes 30 Hz.

Figure 3:
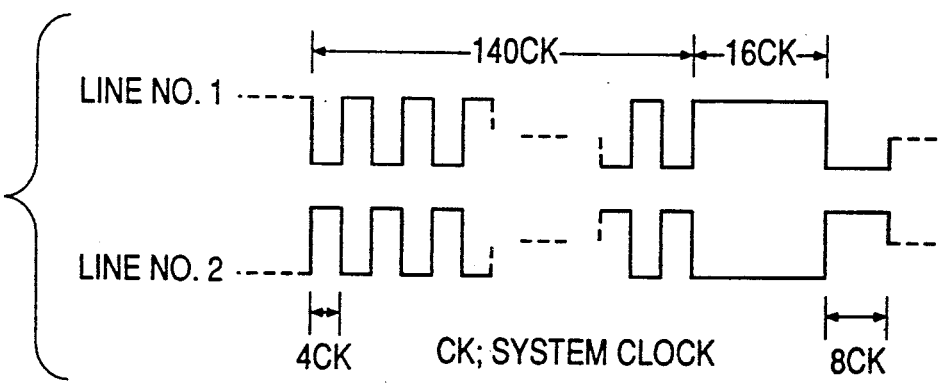
FIG. 3 shows signal waveforms showing a frame synchronizing signal of the MUSE signal.
Figure 4:
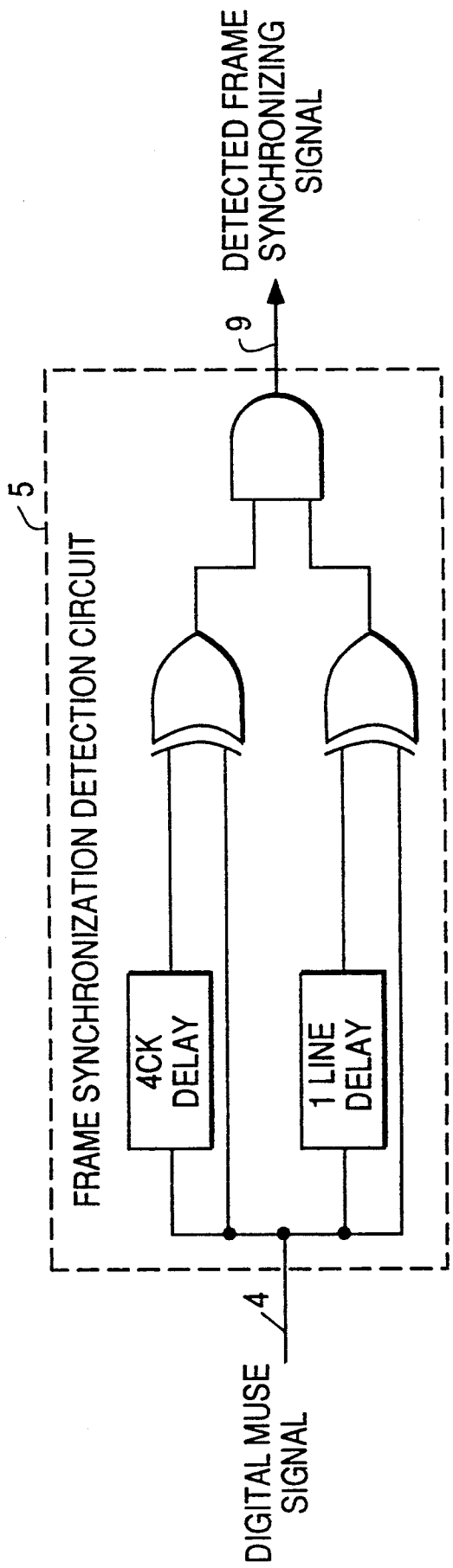
FIG. 4 is a block diagram of a frame synchronous detection circuit shown in FIG. 1.

Next, the frame synchronization is pulled-in. FIG. 3 shows signal waveforms of the frame synchronizing signal of the MUSE signal. The frame synchronizing signal of the MUSE signal which is has two lines each having a signal inverted at intervals of four clocks. Each of the two lines is inverted with respect to the other line. Accordingly, for example, a frame synchronous detection circuit 5 shown in FIG. 4 detects a frame synchronizing signal of the digital MUSE signal 4 by pattern matching using the correlation of the clock and line which is a feature of the frame synchronizing signal. In FIG. 1, the pulling-in of the frame synchronization can be made within such a range that the phase difference between the detected frame synchronizing signal 9 and the internal frame synchronizing signal 8 generated through the counter 6 can compute the sampling phase error through the phase error computing circuit 11, or within the range of ±2 system clocks. As a result, a window circuit 10 monitors the phase difference between the detected frame synchronizing signal 9 and the internal frame synchronizing signal 8, and if the phase difference exceeds ±3 system clocks, generates the frame reset signal 12 for resetting the counter 6. Thus, the frame synchronization can be effected at an accuracy of the range of ±2 system clocks.

In this case, if the window circuit 10 is not provided with the system clock range of ±2 system clocks and the phase difference between the detected frame synchronizing signal 9 and the internal frame synchronizing signal 8 exceeds the range of ±1 system clock, the counter 6 can be reset immediately. However, if the frame synchronization is effected made by a frame reset signal of only one time at an accuracy within one clock, when the detection of a frame synchronizing signal is missed due a noisy signal or the like, the synchronization may disadvantageously be significantly out the synch.

An explanation follows on the phase error computing circuit 11. Supposing that the value at a sample point used as a reference is expressed by D2, and values of sample points which are respectively two clocks preceding and following the standard sample point are respectively expressed by D1 and D3, the following equation is satisfied:

$$\text{Sampling phase error} = (D1 + D3)/2 - D2 \ldots \quad (1)$$

Figure 5:
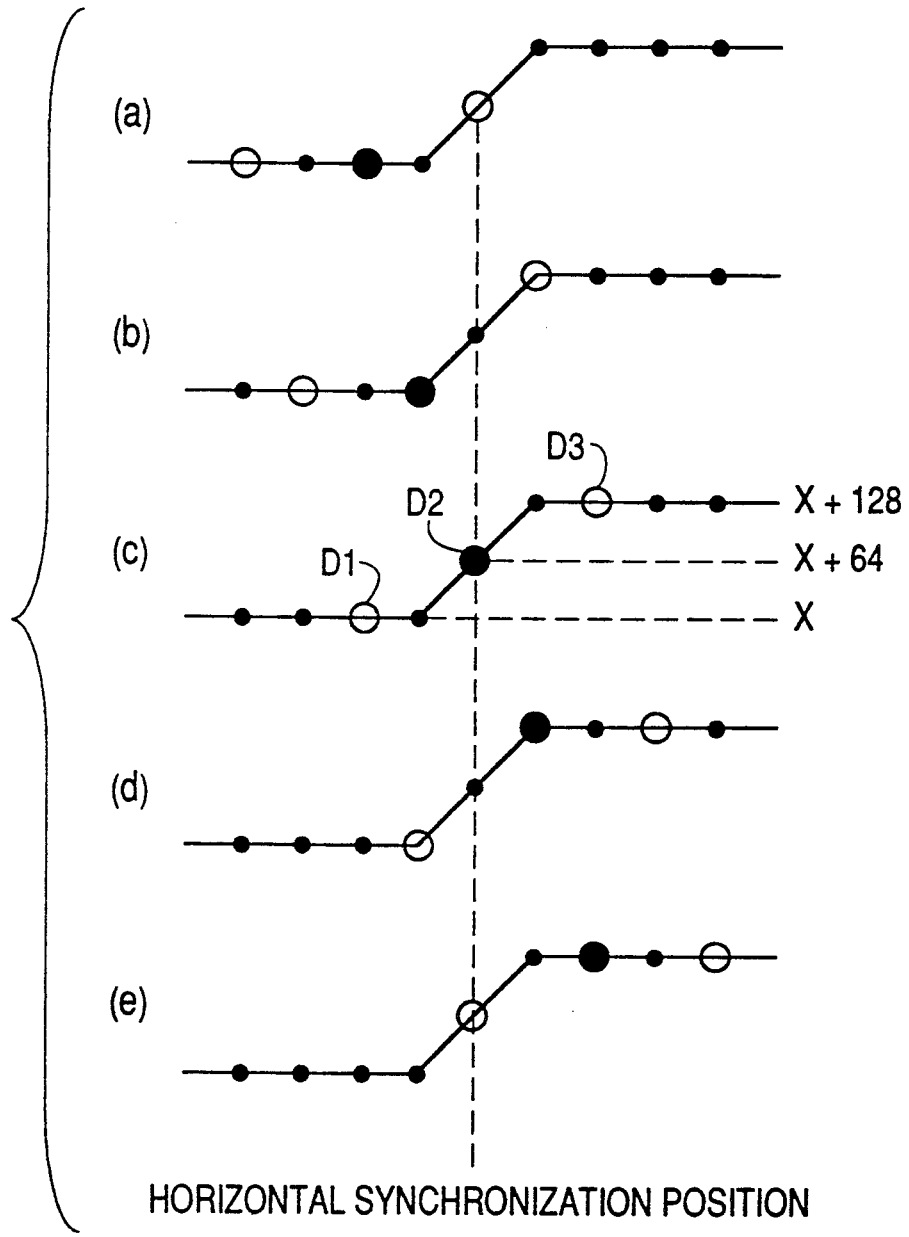
FIG. 5 shows signal waveforms showing a horizontal synchronizing signal of MUSE signal that a phase error computing circuit processes.

In FIG. 5, each line indicates the horizontal synchronizing signal waveform of the MUSE signal and each circle indicate a sample point. The horizontal synchronization position of each signal is the middle point of the inclined segment of the line showing the waveform. The phase error computing circuit 11 calculates the sampling phase error with the internal horizontal synchronizing signal 13 outputted from the counter 6 as the reference. Since the accuracy of the above-mentioned frame synchronization is within the range of ±2 clocks, there are five obtainable values of +2, +1, 0, −1 and −2 in the phase relationship between the horizontal synchronization position and the internal horizontal synchronizing signal 13, which means that calculation patterns (a) through (e) as shown in FIG. 5 exist. If an amplitude value of the horizontal synchronizing signal is 128 expressed by 8 bits, the base level of the horizontal synchronizing signal, the horizontal synchronization position level and the top level of the horizontal synchronizing signal can be expressed as x, x+64 and x+128, respectively. In case of FIG. 5 (a), from eq.(1), the following can be obtained:

Sampling phase error = $(x+x+64)/2-x=32$

Similarly, in cases of FIGS. 5 (b), (c), (d) and (e), 64, 0, −64 and −32 will be obtained for respective sampling phase errors. Out of these, the case of FIG. 5 (c) shows a properly made synchronization in that in case of the ideal digital MUSE signal, the sampling phase error will become zero. There may exist a sampling phase error in an inputted digital MUSE signal in advance, however, it will be less than 16. Thus, if the sampling phase error 14 exceeds 16, the comparator circuit 20 detects that an error does not exist in the inputted digital MUSE signal in advance and the synchronization deviates up to more than one clock, and generates the horizontal reset signal 21. The horizontal reset signal 21 resets the counter 6 to thereby bring the synchronization to the condition of FIG. 5 (c).

The synchronous signal generation for the MUSE signal can be properly achieved under the above-mentioned arrangement and procedure conditions. Next, the synchronous signal generation for an analog MUSE signal will be explained below.

When an analog MUSE signal is inputted, the first and second switches 22 and 23 are switched to the a-side. The A/D converter 2 converts the inputted analog MUSE signal 1 into a digital MUSE signal using the system clock 3. The digital MUSE signal thus obtained is processed in the same way as in the case when a digital MUSE signal is inputted, and the counter 6 is synchronized with the digital MUSE signal at an accuracy range within one clock. Different from the case of inputting a digital MUSE signal is that the sampling phase error 14 is integrated through a loop filter 15, converted through the D/A converter 16 into an analog voltage and then controls the voltage-controlled oscillator 7. That is, in the PLL circuit, an input signal is subjected to A/D conversion using a system clock, its sampling phase error is calculated, and a voltage-controlled oscillator is controlled by the sampling phase error to generate the system clock, whereby synchronous signal generation within one clock is performed, and the synchronous signal generation for the analog MUSE signal is realized.

Figure 6:
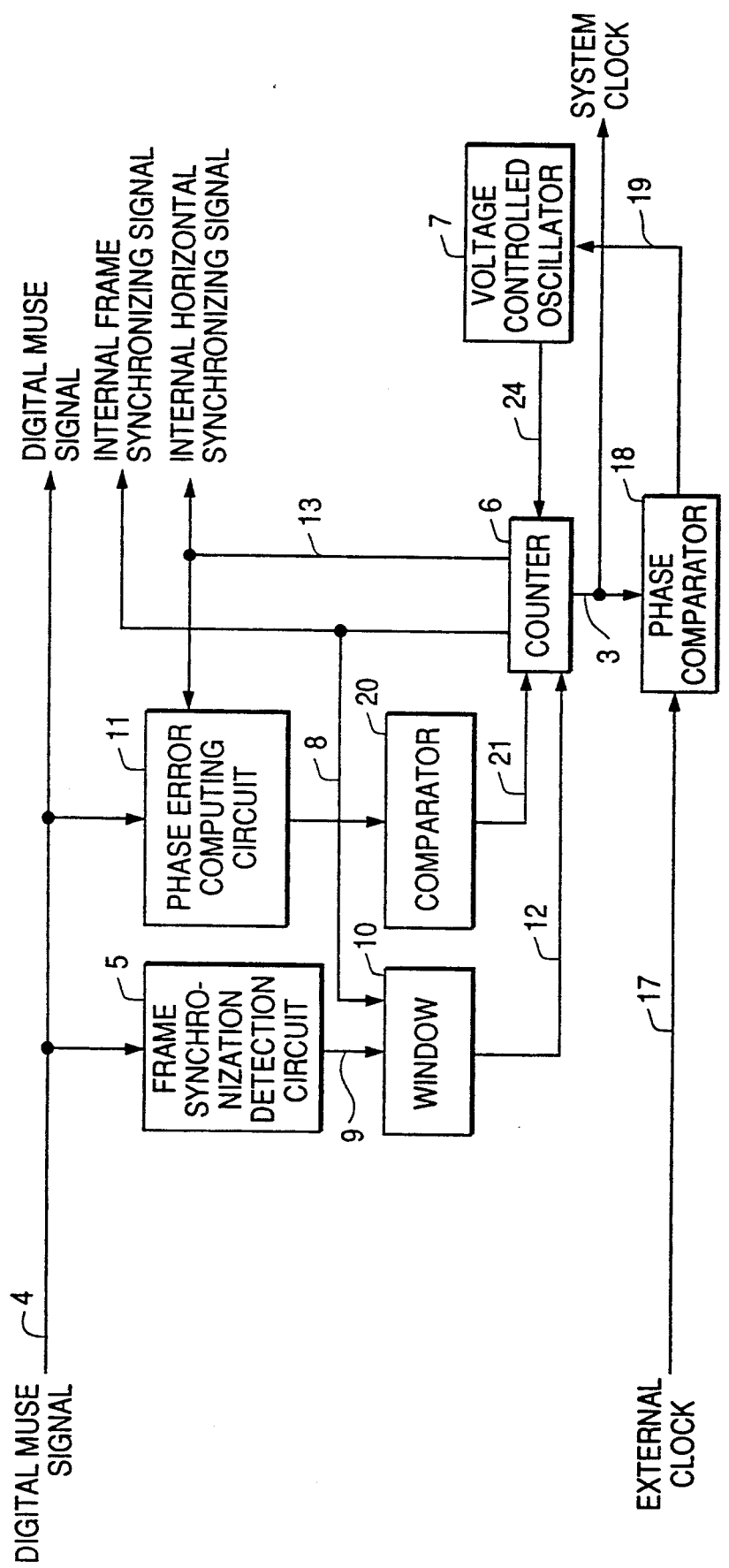
FIG. 6 is a block diagram of a synchronous signal generator for the MUSE signal according to a second embodiment of this invention.

In addition, a synchronous signal generator exclusively used for the digital MUSE signal is shown in FIG. 6. In FIG. 6, such components as first and second switches 22 and 23, loop filter 15 and D/A converter 16 required in the first embodiment are eliminated. Procedures of the synchronous signal generation for the digital MUSE signal in this embodiment are not described here because they are the same as those described in the first embodiment.

What is claimed is:

1. A synchronous signal generator for generating a signal which is synchronous with a MUSE signal comprising:

a frame synchronization detection circuit for detecting a frame synchronizing signal from a digital MUSE signal;

a voltage-controlled oscillator whose oscillating frequency is controlled by a control voltage input thereto so as to output a master clock signal;

a counter for generating a system clock, an internal horizontal synchronizing signal and an internal frame synchronizing signal by frequency-dividing said master clock signal, the counter being resettable to effect either a frame reset or a horizontal reset;

a window circuit for generating a frame reset signal for resetting said counter when a phase difference between the frame synchronizing signal detected by said frame synchronization detection circuit and the internal frame synchronizing signal outputted from said counter exceeds a predetermined value;

a phase error computing circuit for computing a sampling phase error of said digital MUSE signal with the internal horizontal synchronizing signal outputted from said counter as a reference and for outputting the computed sampling phase error;

a comparator for generating a horizontal reset signal for resetting said counter when an output of said phase error computing circuit exceeds a predetermined allowable value;

a phase comparator for detecting a phase difference between an external clock and said system clock and for supplying said control voltage, which is indicative of the detected phase difference, to said voltage-controlled oscillator;

an analog-to-digital converter for sampling an analog MUSE signal using said system clock and for converting the sampled analog MUSE signal into a digital MUSE signal;

a first switch for selectively switching between a directly inputted digital MUSE signal and the digital MUSE signal from said analog-to-digital converter;

a loop filter for integrating an output from said phase error computing circuit;

a digital-to-analog converter for converting an output from said loop filter into an analog voltage; and a second switch for selectively switching between an output voltage from said digital-to-analog converter and an output voltage from said phase comparator and for inputting the switched output voltage to said voltage-controlled oscillator.

2. A synchronous signal generator for generating a signal which is synchronous with a digital MUSE signal comprising:

a frame synchronization detection circuit for detecting a frame synchronizing signal from a digital MUSE signal;

a voltage-controlled oscillator whose oscillating frequency is controlled by a control voltage input thereto so as to output a master clock signal;

a counter for generating a system clock, an internal horizontal synchronizing signal and an internal frame synchronizing signal by frequency-dividing said master clock signal, the counter being resettable to effect either a frame reset or a horizontal reset;

a window circuit for generating a frame reset signal for resetting said counter when a phase difference between the frame synchronizing signal detected by said frame synchronization detection circuit and the internal frame synchronizing signal outputted from said counter exceeds a predetermined value;

a phase error computing circuit for computing a sampling phase error of said digital MUSE signal with the internal horizontal synchronizing signal outputted from said counter as the reference and for outputting the computed sampling phase error;

a comparator for generating a horizontal reset signal for resetting said counter when an output from said phase error computing circuit exceeds a predetermined allowable value; and a phase comparator for detecting a phase difference between an external clock and said system clock and for supplying said control voltage, which is indicative of the detected phase difference, to said voltage-controlled oscillator, thus effecting the generation of a signal which is synchronous with the digital MUSE signal.

* * * * *